(12) United States Patent
Su et al.

(10) Patent No.: US 6,768,303 B1
(45) Date of Patent: Jul. 27, 2004

(54) DOUBLE-COUNTER-ROTATIONAL COIL

(75) Inventors: Sunyu Su, Hudson, OH (US); Mark Xueming Zou, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/098,268

(22) Filed: Mar. 15, 2002

Related U.S. Application Data

(60) Provisional application No. 60/276,297, filed on Mar. 16, 2001.

(51) Int. Cl.[7] ................................................ G01V 3/00
(52) U.S. Cl. ...................................... 324/309; 324/318
(58) Field of Search ................................ 324/309, 307, 324/318

(56) References Cited

U.S. PATENT DOCUMENTS

| | | | | |
|---|---|---|---|---|
| 4,442,404 A | * | 4/1984 | Bergmann ................... | 324/309 |
| 4,721,913 A | * | 1/1988 | Hyde et al. ................. | 324/318 |
| 4,825,162 A | | 4/1989 | Roemer et al. ............. | 324/318 |
| 5,578,925 A | | 11/1996 | Molyneaux et al. ........ | 324/318 |
| 5,594,337 A | | 1/1997 | Boskamp .................... | 324/318 |
| 6,493,572 B1 | | 12/2002 | Su et al. ..................... | 600/422 |

OTHER PUBLICATIONS

D.I. Hoult, et al. "Quadrature Detection in the Laboratory Frame", Magnetic Resonance in Medicine 1, Received Oct. 17, 1983; Copyright 1984, pp. 339–353.
P.B. Roemer, et al., "The NMR Phased Array", Magnetic Resonance in Medicine 16, Received Jun. 2, 1989; Revised Oct. 3, 1989; Copyright 1990, pp. 192–225.
C. Leussler, et al, "Improvement of SNR at Low Field Strength Using Mutually Decoupled Coils for Simultaneous NMR Imaging", SMRM 1990 Annual Meeting Proceedings, pp. 724.
T. Takahashi, et al, "Head–neck Quadrature Multiple RF Coil for Vertical Magnetic Field MRI", SMRM 1997 Annual Meeting Procedeedings, pp. 1521.
J. Wang, "A Novel Method to Reduce the Signal Coupling of Surface Coils for MRI", ISMRM 1996 Annual Meeting Proceedings, pp. 1434.

* cited by examiner

*Primary Examiner*—Brij B. Shrivastav
(74) *Attorney, Agent, or Firm*—Michael Dellapenna, Esq; Armstrong Teasdale, LLP

(57) ABSTRACT

A MRI RF coil includes a first solenoidal section, a second solenoidal section, and a third solenoidal section. The first section is between the second and third sections. The first section has a counter-rotational orientation with respect to the second and third sections.

4 Claims, 6 Drawing Sheets

DCR COIL      SOLENOIDAL ARRAY
              BUILDING BLOCK

SOLENOIDAL ARRAY CONSISTING OF PLURAL
DCR SOLENOID COIL ELEMENTS

ISOLATION BETWEEN COIL ELEMENT PAIR IN DCR SOLENOIDAL ARRAY

SOLENOID COIL 1−SOLENOID COIL 2

SOLENOID COIL 1−SOLENOID COIL 3

SOLENOID COIL 2−SOLENOID COIL 3

DOUBLE-COUNTER-ROTATIONAL COIL

CROSS-REFERENCE TO RELATED APPLICATION

This application claims the benefit of U.S. provisional patent application Ser. No. 60/276,297 filed Mar. 16, 2001.

BACKGROUND OF THE INVENTION

The present invention relates to magnetic resonance imaging and, in particular, to radio frequency coils.

Magnetic resonance imaging (MRI) relies on the detection of the magnetic resonance (MR) signal from abundant protons in the volume of interest. A radio frequency (RF) receive coil is a device to effectively "pick up" the MR signal from a background of noise for image processing. MR signals induced in a RF receive coil are weak signals due to the very small population difference between the two proton energy states at room temperature. One of the major challenges in RF coil design is to improve the MR signal detection sensitivity.

One of the approaches to improve signal detection sensitivity and/or field of view is to use multiple receive coils as an array. The basic idea is that instead of making a larger and less sensitive coil that covers the entire volume of interest, plural smaller and more sensitive coils are distributed over the volume of interest. Each individual coil picks up signal and noise from a localized volume. With separate detection circuitry, each coil element receives image signal simultaneously. Signals from all coil elements are finally combined and processed to reconstruct MR image for the entire volume of interest.

The principle of MRI involves exciting protons and detecting their free induction decay signals. Each proton possesses a tiny magnetic moment precessing about the static magnetic field. The macroscopic behavior of millions of protons can be represented by a resultant magnetization vector aligning with the static magnetic field $B_0$. A strong RF excitation pulse may effectively tip the magnetization away from $B_0$. The free induction decay of this magnetization is detected in a plane perpendicular to $B_0$. Thus, for maximal signal induction, the normal direction of a receive coil must be perpendicular to the direction of the static magnetic field $B_0$.

Based on the direction of static magnetic field, commercial MRI systems are either horizontal or vertical. So-called co-planar type array coils have proved to be effective for horizontal MRI systems for reasons discussed in the previous paragraph. In a co-planar array coil, surface coils are arranged in a co-planar fashion and distributed over a volume of interest.

In general, such co-planar type surface array coils are not very effective for a vertical system because the condition required for maximal signal induction can hardly be fulfilled. Various modifications to the co-planar designs have been proposed with limited success.

It is known that solenoidal type coils have several advantages for a vertical field system, including its sensitivity, uniformity and its natural fit to various body parts. To successfully implement a solenoidal array coil, one must be able to isolate solenoidal coil elements to prevent them from coupling to each other. This is required because all coil elements in an array coil are to receive signals simultaneously. "Cross-talk" between different coil elements is un-desirable. Thus effective coil isolation is a major challenge in solenoidal array coil design.

The so-called Sandwiched Solenoidal Array Coil (SSAC) disclosed in U.S. patent application Ser. No. 09/408,506 by Su et al. includes two solenoidal RF receive coil elements, a counter-rotational solenoidal element and a second solenoidal element sandwiched between the two counter-rotational winding sections.

The counter-rotational solenoidal coil element produces a gradient $B_1$ field that has a double-peak "M" shape sensitivity profile. The second solenoidal coil element produces a single-peak profile sandwiched between the two peaks of the "M" shape profile of the first coil element.

The sensitivity profile of a SSAC is determined by the summation of an "M" shape double-peak profile and a centralized single-peak profile generated by the two solenoidal coil elements. To avoid unwanted dark band artifact in the array coil sensitivity profile, the geometric parameters of both coil elements must be set properly.

The uneven-counter-rotational (UCR) coil and its application to a solenoidal array produces a quasi-one-peak sensitivity profile and a null-$B_1$ point, through uneven winding of its counter-rotational solenoidal sections. A second solenoid coil element can be placed near the null-B1 point of the UCR coil to form an inherently decoupled solenoidal array.

A UCR coil based solenoidal array is more versatile than the SSAC based array due to the fact that the former is easier to implement and that an artifact free array signal summation is easier to obtain. However, it still remains difficult to build larger arrays.

SUMMARY OF THE INVENTION

A MRI RF coil includes a first solenoidal section, a second solenoidal section, and a third solenoidal section. The first section is between the second and third sections. The first section has a counter-rotational orientation with respect to the second and third sections.

DESCRIPTION OF THE PREFERRED EMBODIMENTS

Figure 1:
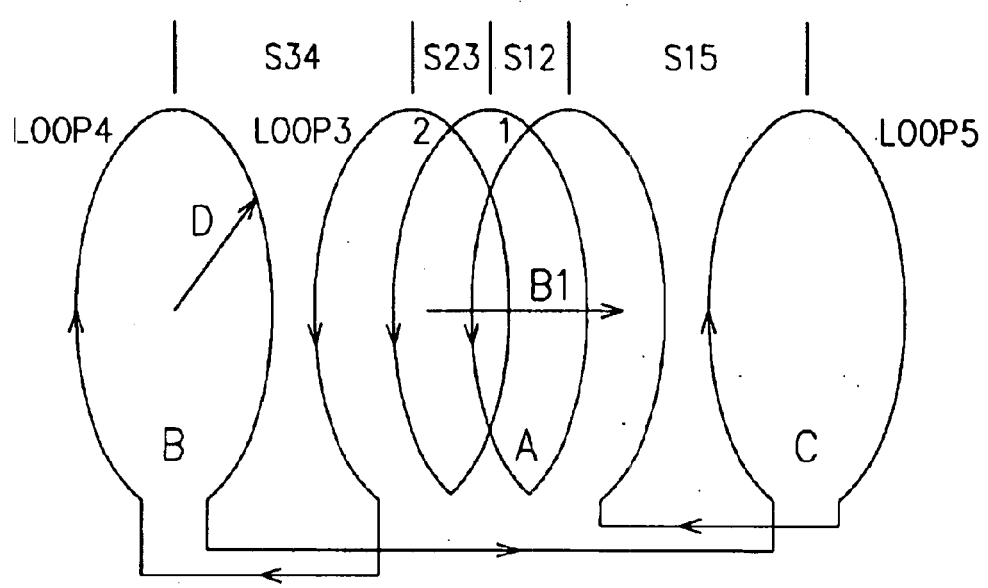
FIG. 1 is schematic diagram of a double-counter-rotational coil (DCR) according to the invention.

Referring to FIG. 1, a double-counter-rotational (DCR) coil 10 includes a middle solenoid section A and two counter-rotational sections B and C. Section A includes three loops with currents flowing in the same direction. Sections B and C includes a single loop with currents flowing in the counter-rotational direction as shown by the arrows. The separation between the neighboring loops is denoted as S12, S23, S34 and S15, respectively. In general, Section A has more turns than either of Sections B and C, and the loop separation and diameter parameters may have different values depending on the specific coil design needs.

Figure 2:
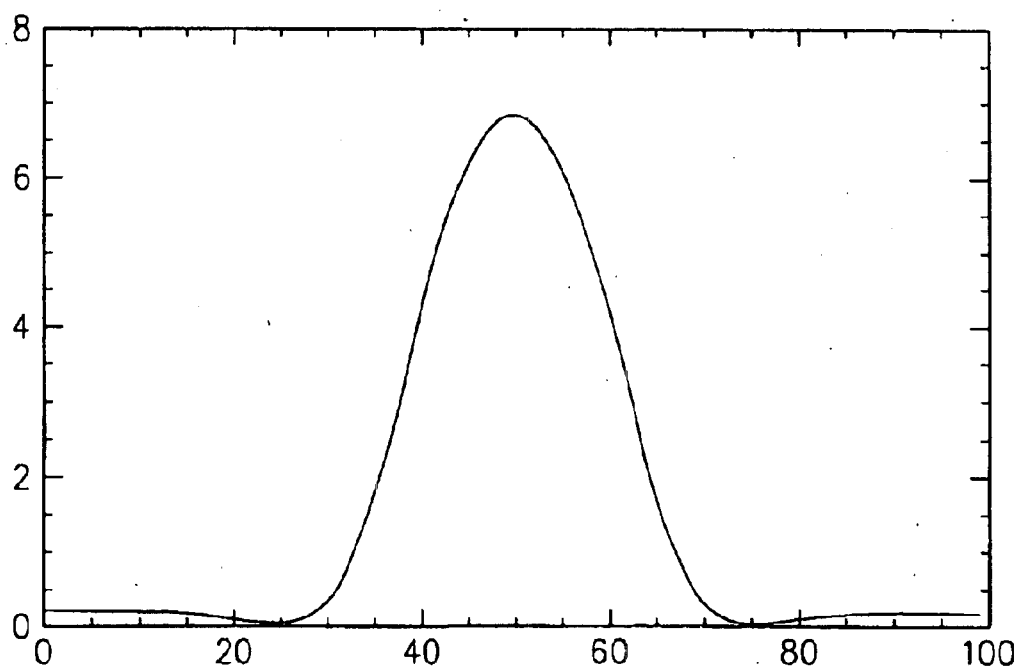
FIG. 2 is a graphical diagram of an exemplary $B_1$ profile of a DCR coil according to the invention.

FIG. 2 is an exemplary graph of the $B_1$ field profile produced by the DCR coil 10. The $B_1$ field has a quasi-one-peak profile. In addition, it produces two null-$B_1$ points, symmetrical to the center of the coil 10.

Figure 3:
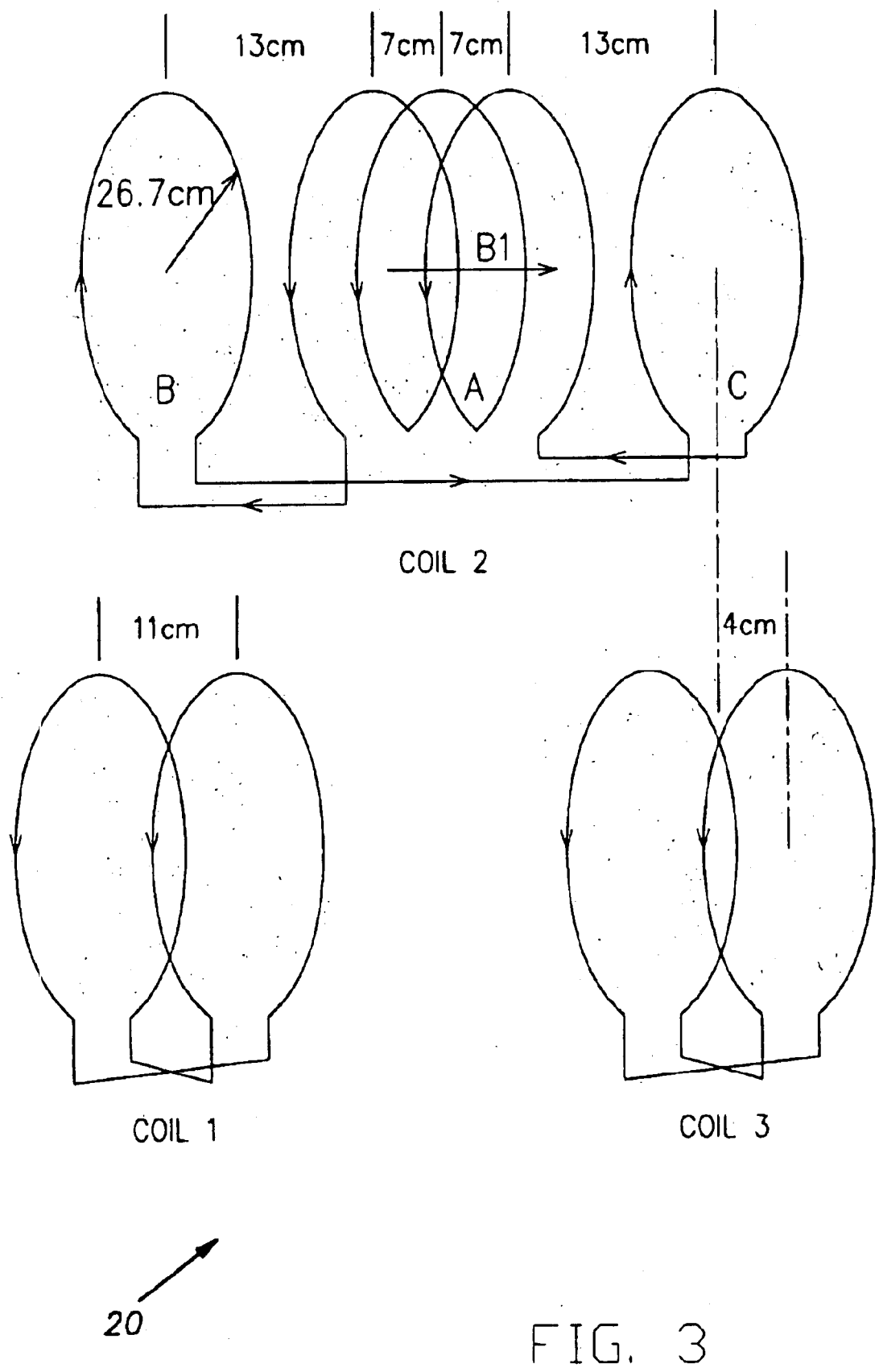
FIG. 3 is a schematic diagram of an array coil employing a DCR coil according to another aspect of the invention.

Referring to FIG. 3, a DCR coil 2 is combined with a solenoidal coil 1 and a solenoidal coil 3 as elements of a solenoidal array coil 20. The coils are actually basically coaxial, but are shown displaced for ease of visualization. Each of the coils 1, 3 are located to take advantage of the respective null $B_1$ points of the coil 2 to minimize coupling between the coils.

Figure 4:
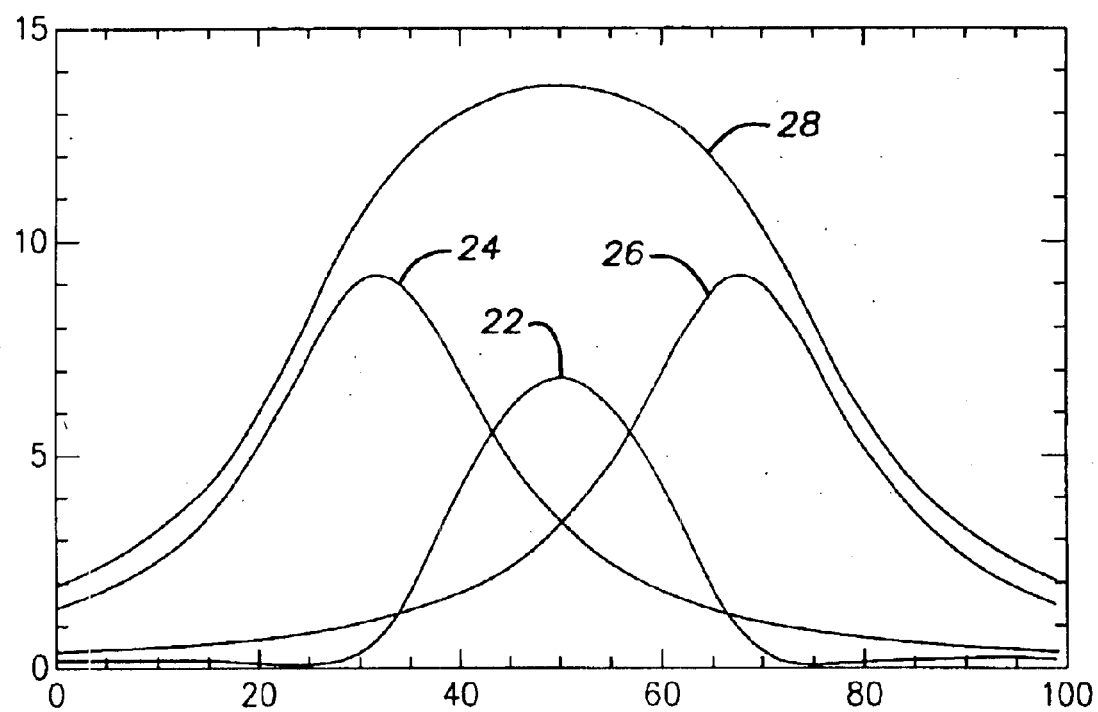
FIG. 4 is a graphical diagram of an exemplary $B_1$ profile of the coil of FIG. 3.

FIG. 4 is an exemplary graph of the $B_1$ fields produced by each coil element of a three-solenoid array coil 20. The central peak 22 represents the B1 field of the coil 2 and the two side peaks 24, 26 represent respective $B_1$ fields of the coils 1,3. Also shown, is the overall $B_1$ profile 28 of the array coil 20. In practice, the number of turns and separations can be designed to meet the signal and filed of view (FOV) requirements.

As mentioned above, a DCR coil element produces two null $B_1$ points, one to each side, providing the possibility for the addition of solenoid coil elements near the null $B_1$ points without magnetic coupling between neighboring coil elements. If each added coil element is also a DCR coil, still additional solenoid coil element can be added near the new null $B_1$ point. In this way, more solenoid coil elements can be included coaxially to the array as needed. Therefore, the DCR coil becomes the building block of solenoidal array that can, in principle, consists of as many solenoid coil elements as desired.

Figure 5A:
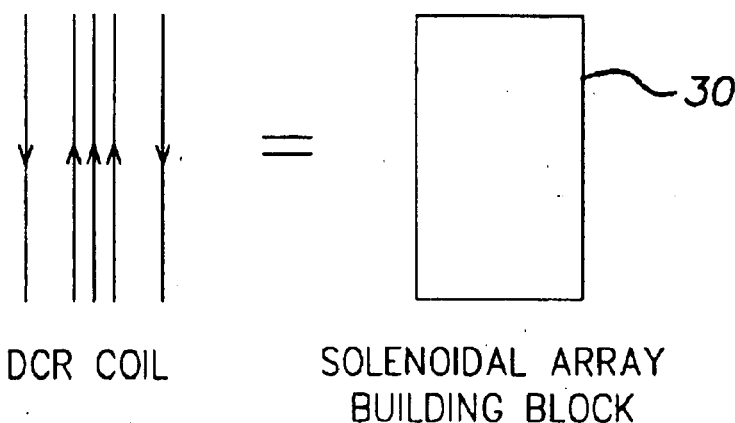
FIG. 5 is a schematic diagram of using DCR coils as multiple elements of an array coil
Figure 5B:
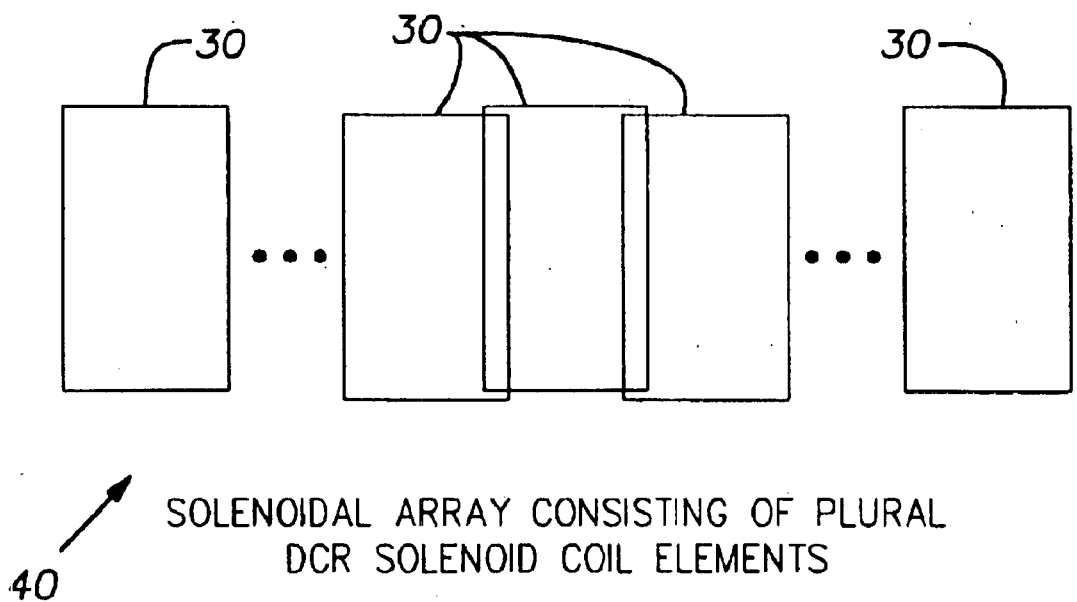

Referring to FIG. 5, a solenoidal array using DCR coil elements 30 as building blocks and for an array coil 40. If one considers the DCR coil 30 as a building block (FIG. 5a), the solenoidal array coil 40 can be built by properly overlapping the building blocks (FIG. 5b).

Magnetic coupling between next neighboring coils is much weaker than the coupling between neighboring coil elements due to their greater separation. Such coupling can be compensated using normal isolation methods. For example, the application of a 10 pre-amplifier to the coil circuit will help next neighboring coil isolation effectively in the same way as that in coplanar array coils.

A prototype DCR solenoidal array was built to prove the concept. The prototype solenoidal array coil included three solenoid coil elements, a DCR coil and two 2-turn solenoidal coil elements. The solenoidal array coil was built and tested at the resonance frequency of 29.8 MHz.

Coil traces were made of 0.2 mm thick and 10 mm wide copper strips wound on a 267 mm diameter acrylic tube. FIG. 3 shows the coil configuration and dimensional parameters.

Figure 6:
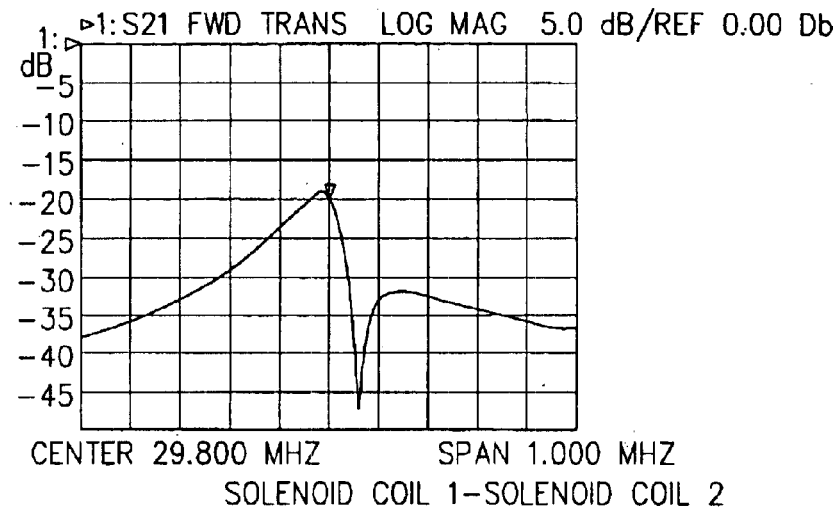
FIG. 6 is a graphical diagram illustrating the isolation between elements of the coil of FIG. 3.
Figure 6:
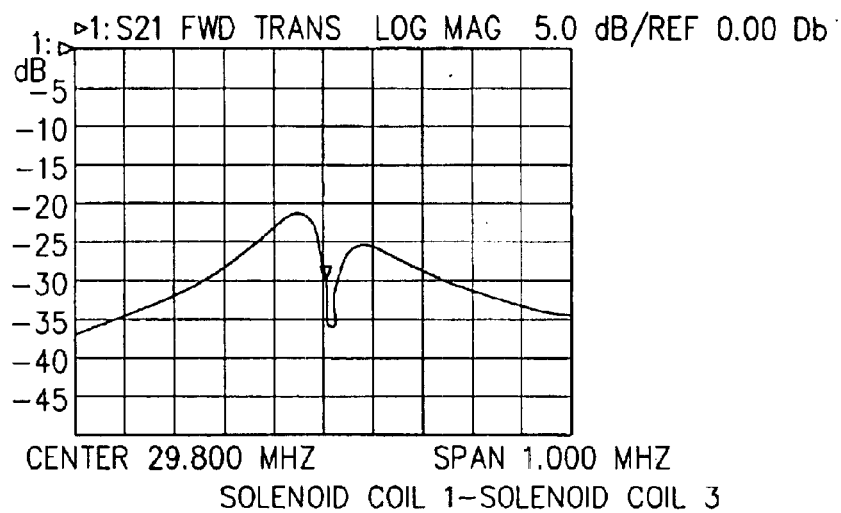
Figure 6:
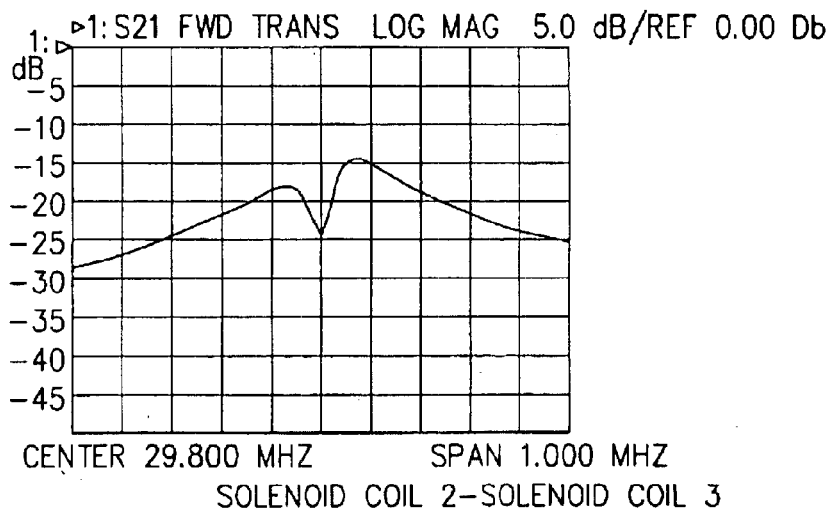

The DCR coil element is inherently decoupled from neighboring solenoid coil elements. No additional decoupling circuit was needed and the isolation between the pairs were excellent. Excellent isolation was achieved between the next neighboring solenoid coil elements by using capacitive decoupling circuits. The S21 parameter for the three coupling modes is shown in FIG. 6.

The prototype solenoidal array coil test results prove the concept of this invention and the technique of making the same.

Various modifications can be made to the basic invention as discussed above. Orthogonal coil elements of various configurations can be added to any solenoid coil element in a DCR solenoidal array to form a quadrature pair to take advantage of the quadrature effect for signal to noise (SNR) ratio improvement. For example, A saddle coil-based element can form a quadrature pair with a DCR solenoid coil element and so can a figure-8 coil element.

Figure 7:
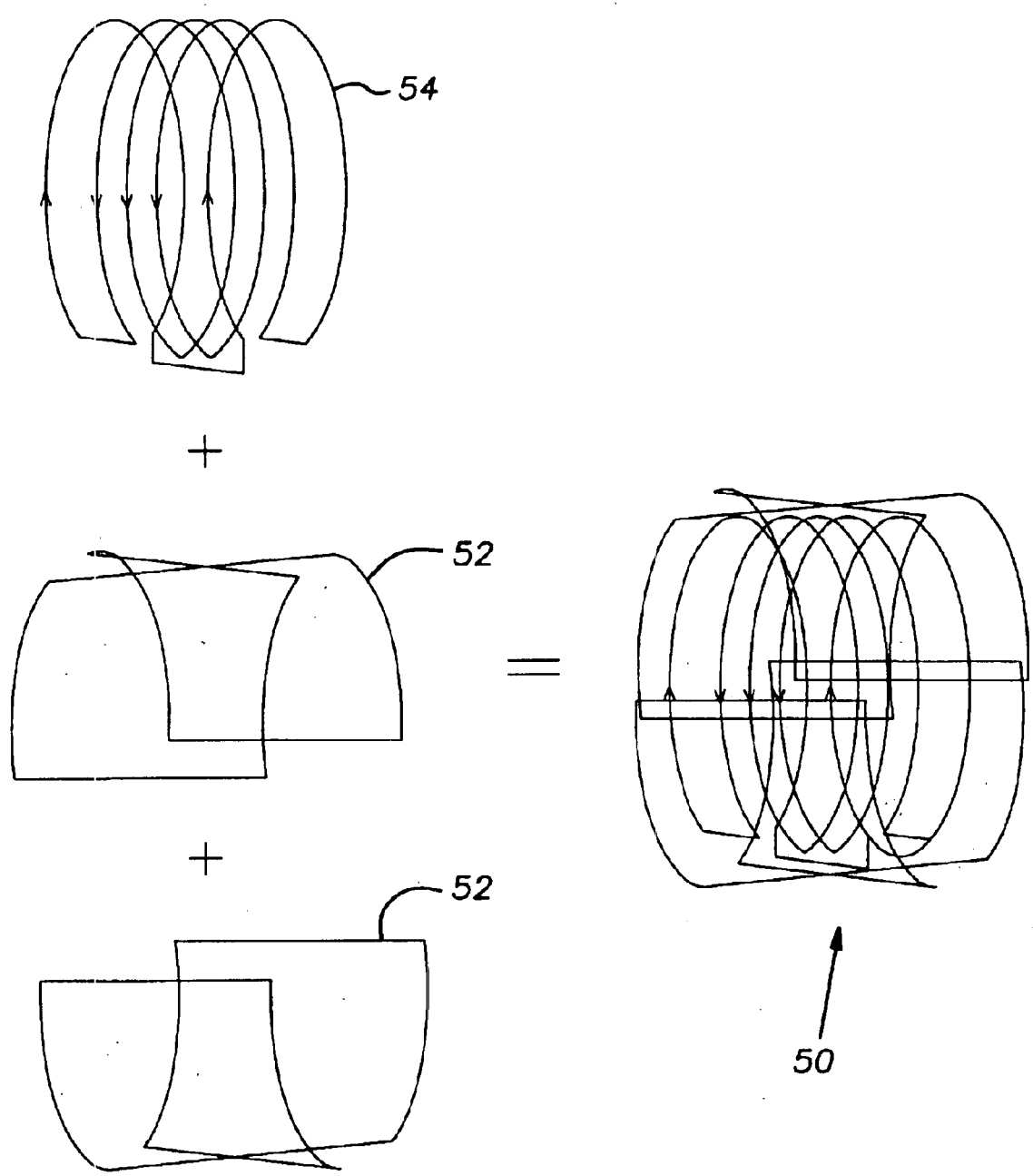
FIG. 7 is a schematic diagram of a DCR coil in combination with double saddle coils to provide a quadrature pair.

For example, referring to FIG. 7, two saddle coils 52 can be added to a DCR solenoid coil element 54 to form a quadrature pair 50. In this design, the DCR coil element 54 is decoupled from either of the saddle coils 52 by field orthogonality. The saddle coil elements 52 are decoupled from each other through an overlapping technique. This configuration is advantageous for large size coils where a large size wrapping-around saddle coil element does not give optimized sensitivity and SNR. One (or both) of the two saddle coil elements can also be replaced by a figure-8 coil element as needed and the above discussion regarding coil decoupling remains the same. Orthogonal coil elements in the above discussion can be added to any one or all of the solenoid coil elements in a DCR solenoidal array.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI RF coil array, said array comprising:
   a plurality of double-counter-rotational coils, each double-counter-rotational coils having:
   a first solenoidal section;
   a second solenoidal section; and
   a third solenoidal section, said first section being between said second and third sections and said first section having a counter-rotational orientation with respect to said second and third sections,
   said double-counter-rotational coils being oriented with overlapping null $B_1$ points to reduce coupling.

2. A MRI RF coil array, said array comprising:
   a first coil having two null $B_1$ points and a quasi-one-peak sensitivity profile;
   a second coil oriented with respect to the first null $B_1$ point to reduce coupling; and
   a third coil oriented with respect to the second null $B_1$ point to reduce coupling.

3. A MRI RF coil array, said array comprising:
   first solenoidal coil having a first section, a second section, and a third section, said first section being between said second and third sections and said first section having a counter-rotational orientation with respect to said second and third sections, said sections being adapted to produce two null $B_1$ points and a quasi-one-peak sensitivity profile;
   a second solenoidal coil oriented with respect to the first null $B_1$ point to reduce coupling; and
   a third coil oriented with respect to the second null $B_1$ point to reduce coupling.

4. A MRI RF coil, said coil comprising:
   a first solenoidal coil having a first section, a second section, and a third section, said first section being between said second and third sections and said first section having a counter-rotational orientation with respect to said second and third sections, said first coil having a first magnetic orientation; and
   a second coil having a second magnetic orientation orthogonal to said first magnetic orientation, said coils being adapted to operate as an orthogonal pair.

* * * * *